US010483238B2

(12) United States Patent
Ziglioli

(10) Patent No.: US 10,483,238 B2
(45) Date of Patent: Nov. 19, 2019

(54) INK PRINTED WIRE BONDING

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 10 days.

(21) Appl. No.: 15/842,650

(22) Filed: Dec. 14, 2017

(65) Prior Publication Data

US 2018/0114778 A1 Apr. 26, 2018

Related U.S. Application Data

(63) Continuation of application No. 15/335,331, filed on Oct. 26, 2016, now Pat. No. 9,859,256.

(51) Int. Cl.
*H01L 23/48* (2006.01)
*H01L 25/065* (2006.01)
(Continued)

(52) U.S. Cl.
CPC ........ *H01L 25/0657* (2013.01); *H01L 21/565* (2013.01); *H01L 23/3121* (2013.01); 
(Continued)

(58) Field of Classification Search
CPC . H01L 25/0657; H01L 24/09; H01L 23/3121; H01L 24/49; H01L 25/50; H01L 21/565; H01L 24/431; H01L 24/85; H01L 2225/06506; H01L 2225/06524; H01L 2225/06548; H01L 2224/48091; H01L 2225/06568; H01L 2224/32245–3226
(Continued)

(56) References Cited

U.S. PATENT DOCUMENTS

2004/0140549 A1* 7/2004 Miyagawa .......... H01L 23/5389
257/700
2016/0093525 A1* 3/2016 Cook .................. H01L 21/4867
257/676

OTHER PUBLICATIONS

O'Reilly et al., "Jetting Your Way to Fine-pitch 3D Interconnects," *Chip Scale Review*, pp. 18-21, 2010.
(Continued)

*Primary Examiner* — Caleb E Henry
(74) *Attorney, Agent, or Firm* — Seed IP Law Group LLP

(57) ABSTRACT

An integrated circuit package with improved reliability and methods for creating the same are disclosed. More specifically, integrated circuit packages are created using one or more sacrificial layers that provide support for ink printed wires prior to package processing, but are removed during package processing. Once each of the sacrificial layers is removed, molding compound is placed around each ink printed wire, which may have a substantially rectangular cross section that can vary in dimension along a length of a given wire. While substantially surrounding each wire in and of itself improves reliability, removing non-conductive paste, fillets, or other adhesive materials also minimizes adhesion issues between the molding compound and those materials, which increases the bond of the molding compound to the package and its components. The net result is a more reliable integrated circuit package that is less susceptible to internal cracking and wire damage.

20 Claims, 9 Drawing Sheets

(51) Int. Cl.
  *H01L 23/00* (2006.01)
  *H01L 23/31* (2006.01)
  *H01L 25/00* (2006.01)
  *H01L 21/56* (2006.01)
(52) U.S. Cl.
  CPC .............. *H01L 24/09* (2013.01); *H01L 24/43* (2013.01); *H01L 24/49* (2013.01); *H01L 24/82* (2013.01); *H01L 24/85* (2013.01); *H01L 25/50* (2013.01); *H01L 24/48* (2013.01); *H01L 2224/04042* (2013.01); *H01L 2224/2929* (2013.01); *H01L 2224/32145* (2013.01); *H01L 2224/48091* (2013.01); *H01L 2224/48227* (2013.01); *H01L 2224/49175* (2013.01); *H01L 2224/73265* (2013.01); *H01L 2224/8584* (2013.01); *H01L 2224/85345* (2013.01); *H01L 2224/85444* (2013.01); *H01L 2225/0651* (2013.01); *H01L 2225/06506* (2013.01); *H01L 2225/06524* (2013.01); *H01L 2225/06548* (2013.01); *H01L 2225/06568* (2013.01); *H01L 2924/1433* (2013.01); *H01L 2924/1461* (2013.01)

(58) Field of Classification Search
  USPC ........................................................ 257/773
  See application file for complete search history.

(56) References Cited

OTHER PUBLICATIONS

Renn et al., "Aerosol Jet® Printing of High Density, 3-D Interconnects for Multi-Chip Packaging," *6th International Conference and Exhibition on Device Packaging*, Scottsdale/Fountain Hills, Arizona, Mar. 11, 2010, 4 pages.

* cited by examiner

INK PRINTED WIRE BONDING

BACKGROUND

Technical Field

The present disclosure is directed to ink printing of wires in integrated circuit packages using a sacrificial layer for ink wire support that is removed during integrated circuit package processing.

Description of the Related Art

Various ink printing techniques exist to form wires in packaging. One example is, aerosol ink printing, which uses aerodynamic focusing to precisely and accurately deposit electronic inks onto a substrate. More specifically, liquid ink containing solid particles is placed in a sealed jar or chamber and atomized to create an aerosol of ink droplets with entrained particles. Then, the aerosol is condensed as it moves to a deposition head, where a sheath gas "focuses" the dense aerosol mist into a tight stream of particle laden droplets flowing inside the sheath gas. This stream can then be directed to a surface of a substrate to deposit the focused mist on the substrate. Aerosol ink printing devices can be driven by standard CAD data that is converted to make a vector based tool path for a motion control system, which allows for precise control in depositing such inks.

One specific application of aerosol ink printing is for creating interconnects between layers or die, of an integrated circuit package, with some systems using an ink containing metal particles and multiple deposition heads to print up to 25,000 or more interconnects per hour. However, according to these methods and devices, a glue or non-conductive paste ("NCP") fillet supports the aerosol ink printed wires in the integrated circuit package. This glue or NCP occupies gaps between layers, or in other words, is placed between successive edges of one or more die, such that a typical aerosol ink printed wire would be printed over an edge of a first die, then over the glue or NCP fillet between layers, before being printed over an edge of a second die, and so on, until the wires are printed down to a connection on a surface of a printed circuit board ("PCB") or other surface-mount device ("SMD"). Once the wires are printed, a molding compound is then placed over the SMD, the NPC and the wires to form the final integrated circuit package.

While technologies like aerosol ink printing allow for smaller integrated packages to be created, the expansion of trapped moisture and other issues in progressively smaller packages can lead to progressively larger problems, especially concerning reliability of the finished package. For example, trapped moisture in the package can result in internal separation, or delamination, of the wires from the die, of the molding compound from the NCP or of the molding compound from the wires. This delamination can lead to further problems, such as wire damage, die damage, and internal cracks in any part of the package.

In typical applications of aerosol ink printing, these problems arise due to the adhesion of the molding compound to the fillet, which is typically poor. However, there are also issues with wires having bends, or angles, along the length of the wire, because the bend or angle acts as a weak point compared to other sections of the wire. Therefore, a uniform force applied to the wire, possibly as a result of expanding moisture, leaves the bends or angles with a higher likelihood of cracking or breaking. In addition, the molding compound cannot fully surround and protect the wires, as the NCP fillet remains under the wire in the final packages. As a result, the poor adhesion and coverage of the molding compound within the integrated circuit package allows for expanding moisture to more easily separate components in the system, with the overall effect being a less reliable package.

BRIEF SUMMARY

The embodiments described in the present disclosure are directed to improving reliability of integrated circuit packages by using printed wires on one or more sacrificial layers that evaporate or are otherwise removed during package processing. After each of the sacrificial layers evaporate, molding compound can be placed on all sides of each ink printed wire, which increases support for each wire compared to glues or NCP fillets that remain under ink printed wires after package processing. In some variations, each of the ink printed wires may have a substantially rectangular cross section that can change in width, height, or a combination thereof, along a length of the ink printed wire. Other possibilities also include printing wires with different compositions in the same integrated circuit package.

Other exemplary embodiments of the present disclosure describe methods for creating such integrated circuit packages. Some of those embodiments include attaching a die to a substrate and printing a plurality of wires over a surface of a sacrificial layer between pillars or bumps on the die and contact pads on the substrate. Then, a molding compound can be placed over the substrate, the die, and the plurality of wires with the molding compound substantially surrounding a portion of each wire. In yet other embodiments, the pillars or bumps have different heights and more than one sacrificial layer and more than one plurality of wires is used to connect the pillars or bumps of different heights to the contact pads.

A second exemplary method of the present disclosure shows that the present disclosure is not limited to use with a single die. Rather, the present disclosure provides the flexibility to use multiple die, multiple sacrificial layers and pillars with different heights on each die, among other combinations. For example, two die, each having pillars with a different height may be used with two sacrificial layers and multiple pluralities of wires to connect the pillars either to each other or to contact pads positioned successively further away from the die. Then, a molding compound is placed over the substrate, the die and the plurality of wires to form the final integrated circuit package with the molding compound substantially surrounding a portion of each wire. In this way, embodiments of the present disclosure allow for more connections to be made within an integrated circuit package, while also increasing the reliability of the package as a whole.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1:
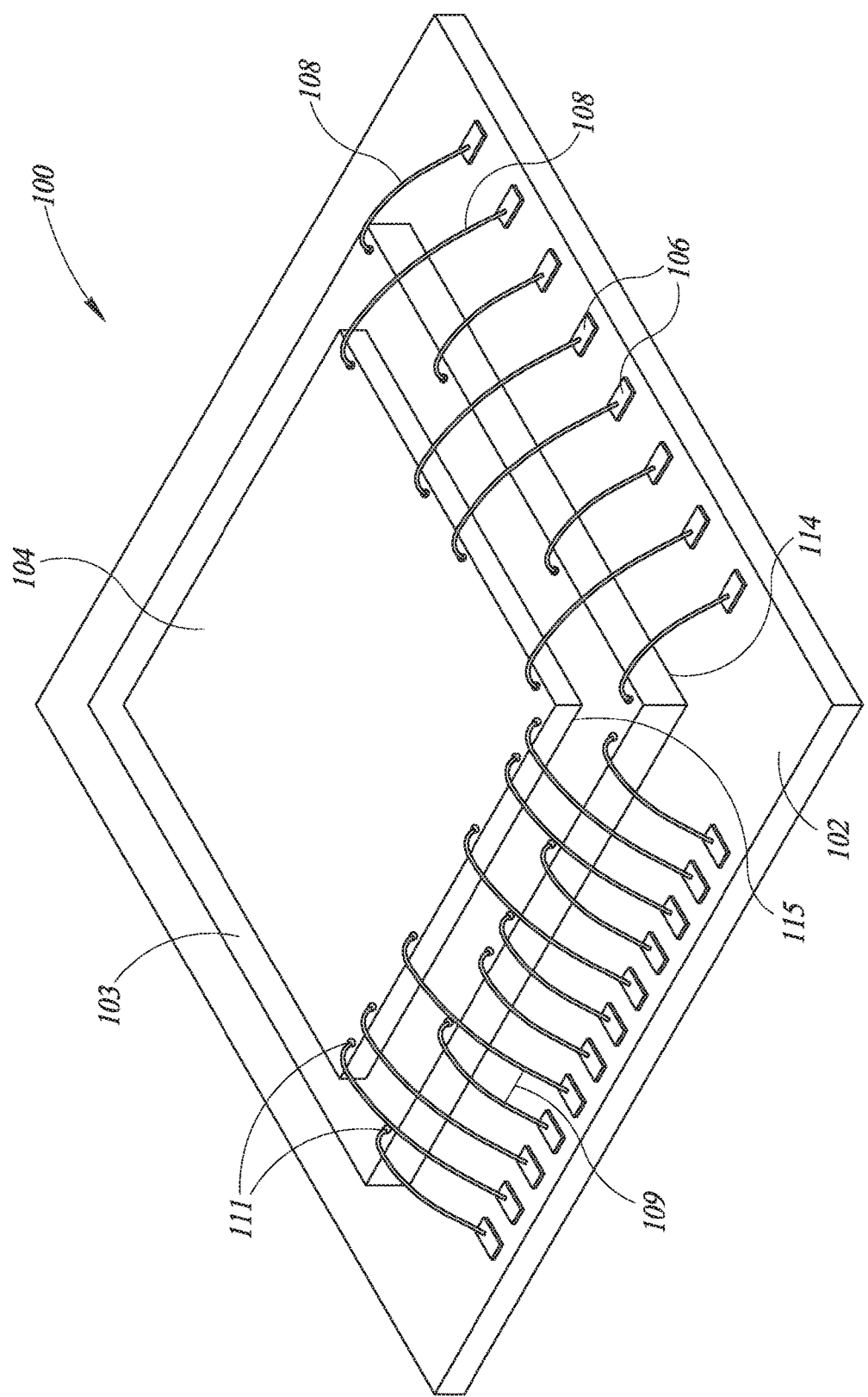
FIG. 1 is an isometric view of an exemplary embodiment of an integrated circuit package according to the present disclosure having one or more ink printed wires coupled between a substrate and two die.

In the following description, certain specific details are set forth in order to provide a thorough understanding of various embodiments of the disclosure. However, one skilled in the art will understand that the disclosure may be practiced without these specific details. In some instances, well-known details associated with chip packaging have not been described to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

The present disclosure is directed to improving reliability of ink printed wires in integrated circuit packages. FIG. 1 is an embodiment of the present disclosure with an integrated circuit package 100 having a package substrate 102, where an encapsulant is not shown to illustrate an arrangement of a first die 103 and a second die 104 with ink printed wires 108. The final product that includes this package will include a molding compound or the encapsulant that fully surrounds each of the ink printed wires and covers the die. The encapsulant will be described and illustrated below.

The package 100 includes a plurality of the ink printed wires 108 that are formed in conjunction with embodiments of the present disclosure where a sacrificial material was used during a manufacturing process to support the ink printed wires. The sacrificial material does not remain in the final product. The package 100 includes the first die 103 and the second die 104 stacked on the first die 103 on the package substrate 102.

The package substrate 102 is of the type FR4 (organic substrate) with a substantially rectangular shape, although other embodiments may have different compositions or shapes depending on the application for the integrated circuit package 100. The package substrate 102 includes a plurality of contact pads 106 coupled to or formed on the package substrate 102. The contact pads 106 are aligned in rows around edges of the package substrate 102. Each of the contact pads 106 are shown as having a substantially rectangular shape, although other arrangements and shapes are envisioned. Further, each of the contact pads 106 can have a composition of a single material or a number of different materials, with some embodiments using a highly conductive material, such as gold. In any event, a number of the contact pads 106 will vary depending on how many connections are made in any given integrated circuit package.

The package substrate 102 is coupled to the first die 103 using a first die attach 114, which is a glue or a tape suited for that purpose, although other coupling devices may be used. The second die 104 is coupled to the first die 103 by using a second die attach 115 having a similar, or different, composition as the first die attach 114. Other embodiments include additional die coupled to the integrated circuit package 100. Each of the first die 103, the second die 104, and any additional die may be a microelectromechanical system ("MEMS") or an Application Specific Integrated Circuit ("ASIC"), among others.

The first die 103 and the second die 104 are electrically coupled to the substrate by the plurality of ink printed wires 108 that extend from at least one of the contact pads 106 to a respective bump 111 on each of the first die 103 or the second die 104. In FIG. 1, the wires 108 have a curvature that corresponds to a curvature of a removed sacrificial layer that was removed during manufacturing. This curvature is different than a standard wire formed using wire bending machinery as the ink printed wires take a shape of an underlying material.

Figure 2A:
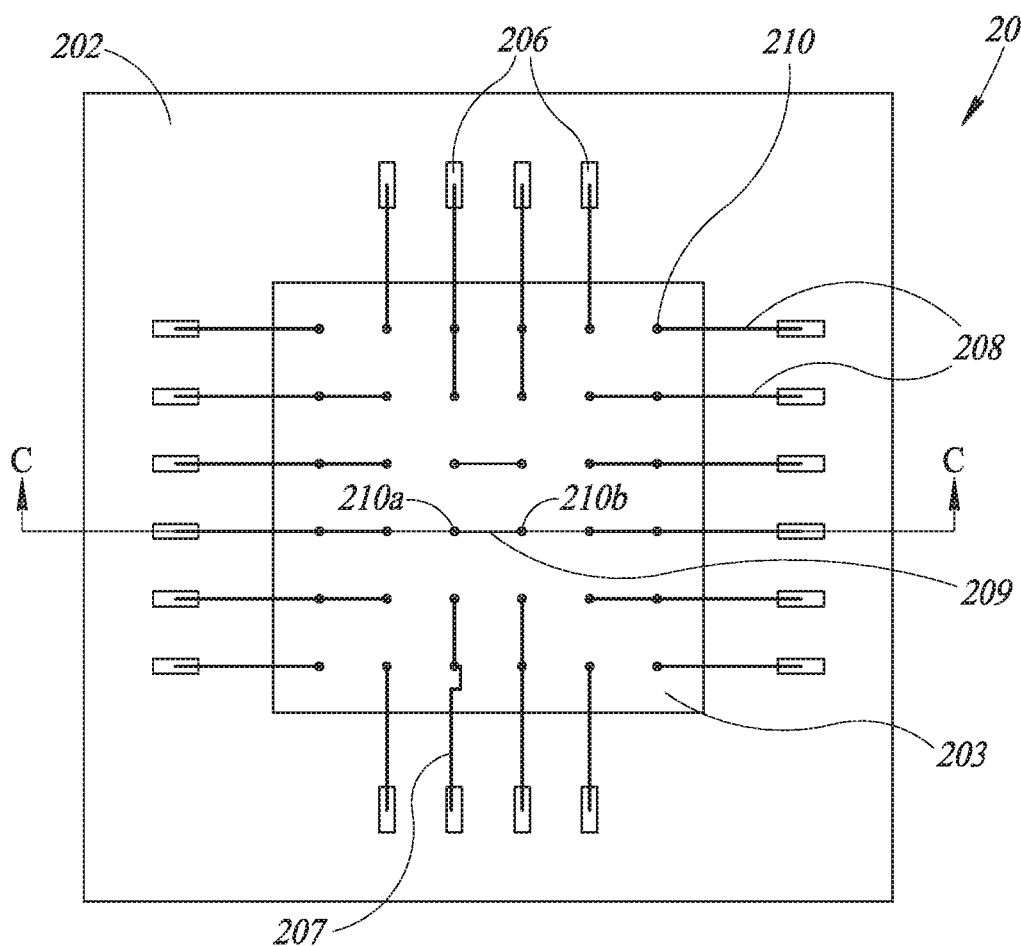
FIGS. 2A-B are views of an alternative exemplary embodiment of the integrated circuit package according to the present disclosure.
Figure 2B:
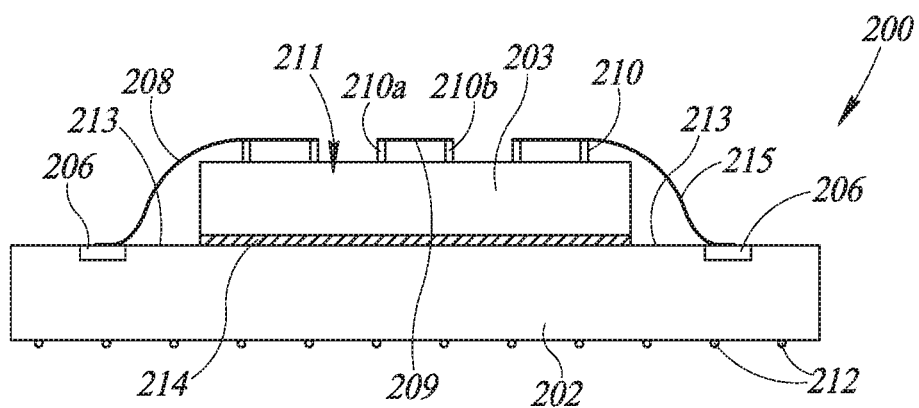

In some embodiments, the bumps 111 may be solder balls, while other embodiments replace the bumps 111 with one or more pillars 110, as in FIG. 2A-B. Each of the ink printed wires 108, or other ink printed wires described in the present disclosure are formed using an ink printing wire technique that allows for a pitch 109 between wires 108 that can be less than 100 micrometers with computer-aided design ("CAD") allowing for accurate placement of the wires 108. Accordingly, a density of the wires greater than standard wire formation techniques can be achieved using ink printing of the wires.

Figure 3A:
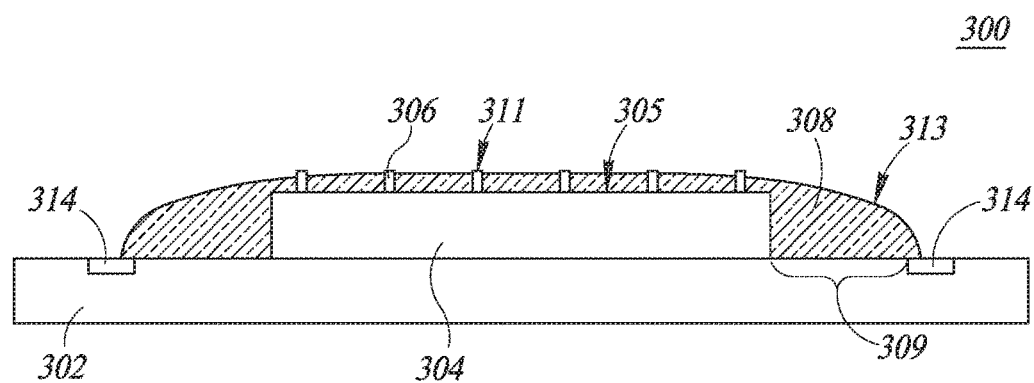
FIGS. 3A-F are views of an exemplary method according to the present disclosure for creating an integrated circuit package using a first sacrificial layer and one or more ink printed wires with a die.

The wires 108 are formed on a sacrificial layer 308, see FIG. 3A, which supports the wire until the wire can be cured or otherwise transitioned to a more rigid wire. The sacrificial material 308 is removed during the curing or in a separate step. Each wire can have a composition of a single material or a combination of a variety of materials. For example, each of the ink printed wires 108 or groups of the printed wires may each be formed of a different material. Materials included in the printed wires include, but are not limited to gold, platinum, silver, nickel, copper, aluminum, other metals, carbon, ruthenate, other resistors, single wall carbon nanotubes, multi wall carbon nanotubes, other non-metallic conductors, polyimide, polyvinylpyrrolidone, opaque coatings, UV adhesives, UV acrylics, and other dielectrics and adhesives, organic or non-organic semiconductors, and other general solvents, acids, bases, photo and etch resists, DNA, proteins, and enzymes.

FIGS. 2A-B show a top-down view and a cross-sectional view, through line C-C, of another embodiment of an integrated circuit package 200 having a plurality of ink printed wires 208. No encapsulant is illustrated in this set of Figures, however, a final product, as will be shown below, will have encapsulant between the wires and the die and covering an entire top surface of the wires, the die, and the package substrate.

The package substrate 202 includes one or more contact pads 206 positioned adjacent to edges of the package substrate. A number of contact pads 206 illustrated in this Figure is significantly fewer in number than what can be achieved in a final product using techniques of the present disclosure. The illustrated contact pads provide context for advantages of the techniques of the present disclosure.

A die 203 is coupled to the package substrate with a die attach 214. The die is centrally positioned within the contact pads. The contact pads surround the die and are positioned between the die and the edge of the package substrate. The die has an active surface 211 that includes a plurality of electrical connections that provide signals to and from the die to another device. The die 203 includes one or more pillars or bumps 210 extending slightly above the surface of the die 203. Each pillar 210 is electrically coupled to a component or components within the die.

The pillars or bumps 210 provide a surface onto which a plurality of ink printed 208 wires are formed and are electrically coupled. As will be described in more detail below, the ink printed wires are formed on a sacrificial material this formed on the active surface 211 of the die, on sides of the die and on a portion 213 of the substrate. The encapsulant supports the wires during the printing process, such that each wire has a curvature 215 that corresponds to a curvature of an outer surface of the removed sacrificial layer. As can be seen, the sacrificial layer does not cover the contact pads such that each wire extends from at least one of the pillars 210 to one of the contact pads 206.

In this embodiment, central ones of the pillars 210a, 201b are coupled to each other with an ink printed wire 209. This wire is not directly coupled to a contact pad. These pillars may be coupled electrically to adjacent pillars in the die or may simply be tied together. The operation of each die will dictate the arrangement and orientation of the wires and pillars of each die. For example, this ink printing technique provides an opportunity to form wires 207 that one or more substantially 90 degree angles along a length of the wire 207. Although not shown in this image, having precise control of a physical path of a wire can give the designer flexibility in layout which can be beneficial in dense designs. Said differently, ink printed wires allow for increased density of wires and non-standard wire shapes, such as ones with 90 degree bends from a top down perspective.

The package substrate 202 also has a second surface, having a plurality of solder balls 212, such as in a Ball-Grid Array ("BGA"). The solder balls 212 allow the package substrate 202 to couple with other features of a larger system, such as an electrical coupling to a printed circuit board ("PCB") or other surface mount device ("SMD"). In other embodiments, the package substrate 202 is be a Quad Flat No-leads arrangement ("QFN") with a substantially planar pad and connections positioned around the perimeter of the pad, although yet other embodiments may have different arrangements. The contact pads are coupled to the balls 212 through electrical connections in the substrate 202.

FIGS. 3A-3F are various steps in a process of forming ink printed wires 316 in accordance with an embodiment of the present disclosure. By using a sacrificial layer 308 for ink wire support accurate user control of wire placement is achieved, such as using CAD systems. After the sacrificial layer is removed, increased wire support is achieved from a molding compound 312, see FIG. 3F, in a final product. The molding compound substantially surrounds each of the ink printed wires 208. A wider variety of wire formations are possible within the integrated circuit package 300 using this technique. Such formations can include printing at least one wire 310a that follows a curvature of the sacrificial layer 308 or other wires 310b that are substantially planar between pillars 306. This flexibility in designing and arranging the integrated circuit package 300 allows for more connections to be made within one package and an increased density of wires, while also maintaining or improving reliability due to the additional support provided by the molding compound 312 contacting all exposed sides of the ink printed wires 310a, 310b.

To provide more detail regarding the use of sacrificial layer 308 and the molding compound 312 surrounding each wire in forming an integrated circuit package 318, a first exemplary device 300 is described in FIGS. 3A-F. The process of creating integrated circuit package 318 begins in FIG. 3A by attaching a die 304 to a package substrate 302 having a plurality of contact pads 314. The die 304 includes one or more pillars, bumps, or other raised protrusion 306 extending away from a first surface 305. The die is attached to the substrate using a die attach or other coupling devices. Although the package substrate 302 may have additional features similar to package substrate 202 of FIG. 2B, such details are excluded in the interest of brevity.

Each of the pillars are evenly spaced from each other arranged on the first surface 305 of the die 304. Once the die 304 is attached to the package substrate 302, the sacrificial layer 308 is deposited on a portion 309 of the package substrate 302 and a portion of the die 304. The portion 309 may correspond to an area that is between the die and the contact pads 314. In some examples, the sacrificial layer 308 may substantially cover the die 304 between two of the contact pads 314, although a height of the sacrificial layer 308 can vary with a height of the pillars 306. In yet other embodiments, the height of the sacrificial layer 308 depends on whether additional sacrificial layers are to be deposited after the thermal sacrificial layer 308. In this embodiment, the pillars are all a same height, which allows a top surface 311 to remain exposed above the sacrificial layer 308.

The sacrificial layer 308 is a thermal sublimating material, or a sacrificial material comprised of hydrocarbon polymers that sublimate, or transition from a solid phase to a gas phase without experiencing a liquid phase, when heated to a certain temperature. Examples of possible hydrocarbon polymers for use as the sacrificial layer 308 include, but are not limited to: naphthalene, cyclododecane, anthracene, pyre, perylene, and zync acetate. The sacrificial layer 308 is kept in place by a viscosity of the sacrificial material or by masking on the package substrate 302, or other containment methods, such as a barrier or wall (not shown). In this embodiment, the sacrificial material overlaps a small portion of the contacts.

Figure 3B:
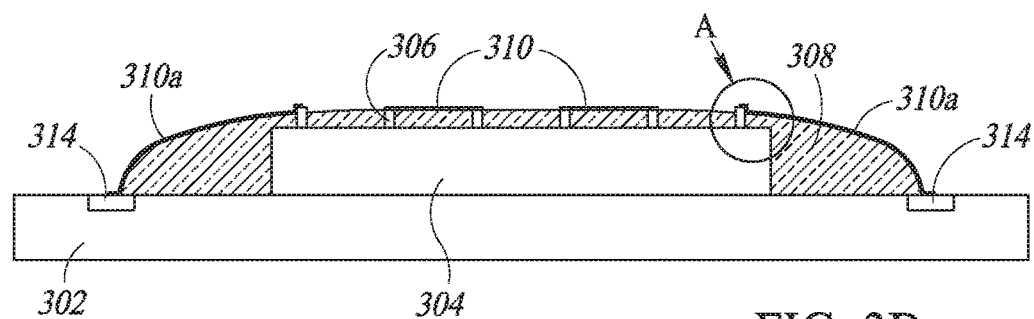
Figure 3C:
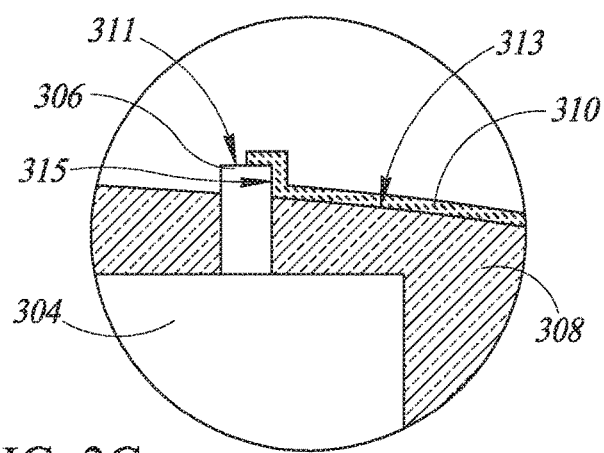

Once the sacrificial layer 308 is in place, one or more ink printed wires 310a are printed along a surface 313 of the sacrificial layer 308, as in FIG. 3B. The ink printed wires 310 extend from and are electrically coupled to the top surface 311 of the pillars 306 on the die 304 to the contact pads 314 on the package substrate 302. Other ink printed wires 310a extend between pillars 306. FIG. 3C shows an enhanced view of the region A, which includes the ink printed wires 310 formed on the surface 311 of the pillar and the surface 313 of the sacrificial layer 308. The ink printed wire is formed in direct contact with the top surface 311 and a side surface 315 of the pillar.

Figure 3D:
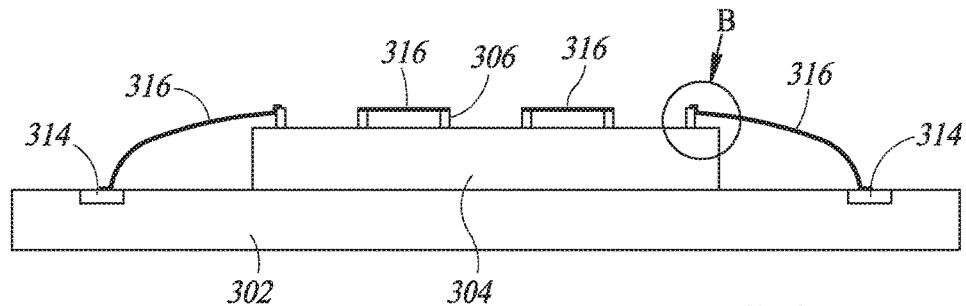

After printing the ink printed wires 310a, 310b, heat is applied to cause the sacrificial layer 308 to sublimate or otherwise be removed. Similarly, heating causes the ink printed wires 310 to sinter into a plurality of solid ink printed wires 316, as shown in FIG. 3D. In other words, sintering is the process of heating the ink printed wires 310 until gas remaining in the ink printed wires 310 is removed, which, in turn, solidifies dense particles suspended in the gas to form the solid ink printed wires 316 that electrically couple the contact pads 314 to the pillars 306. In some embodiments, sublimating and sintering may happen simultaneously, or by using a constant temperature during heat application. Alternatively, the sublimating or removing and sintering may be in different steps. The solidifying of the wires may occur before the sacrificial material is removed as the sacrificial material provides support for the uncured wires.

Figure 3E:
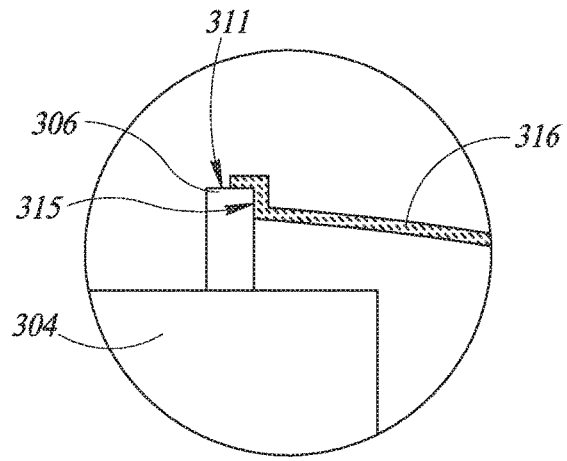

FIG. 3E is an enhanced view of the region B after the sacrificial material is removed. The solidified ink printed wire is "floating" above the die and the substrate as it is coupled to the pillars 306 on the die 304. The solid ink printed wire 316 is contacting the top surface 311 and the side surface 315 of the pillar 306 and having one or more substantially 90 degree angles and having a curvature that generally follows a curvature or shape of the sacrificial layer 308.

Figure 3F:
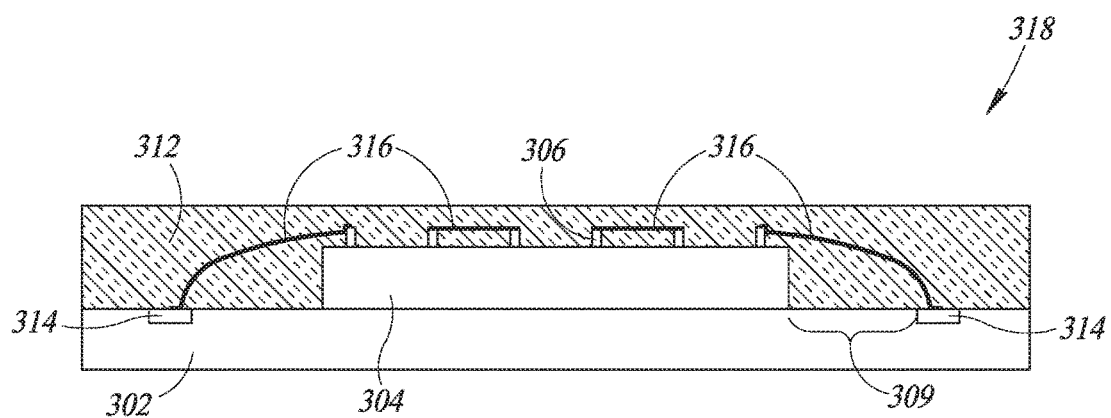

Finally, a molding compound 312 is formed over the die 304, the package substrate 302, and each of the solid ink printed wires 316 to create the integrated circuit package 318, as in FIG. 3F. The molding compound 312 contacts the solid ink printed wires 316 on all sides. The molding compound covers the area 309 and is between the substrate and the wires. The molding compound is also between the die and the wire on the surface of the die.

By substantially enclosing the solid ink printed wires 316 in molding compound 312, the reliability of the integrated circuit package 318 is improved because adhesion issues are minimized, which leads to a lower risk of delamination. Further, the additional support of the molding compound 312 on all sides of the solid ink printed wires 316, in combination with the free range of motion of an ink printing device, can result in additional wire configurations having significant angles or bends, such as wire 207, see FIG. 2A.

Figure 4A:
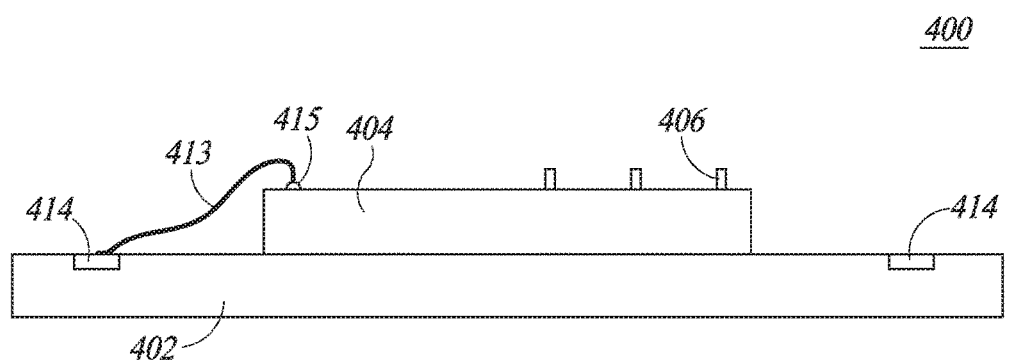
FIGS. 4A-E are views of an alternative exemplary embodiment of the present disclosure including a printed wire and a secondary wire.
Figure 4B:
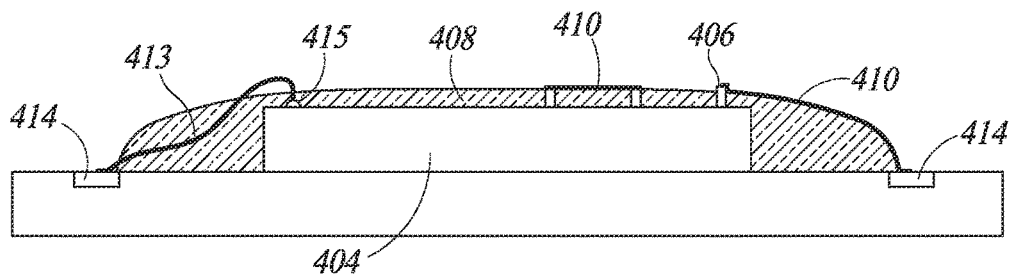
Figure 4C:
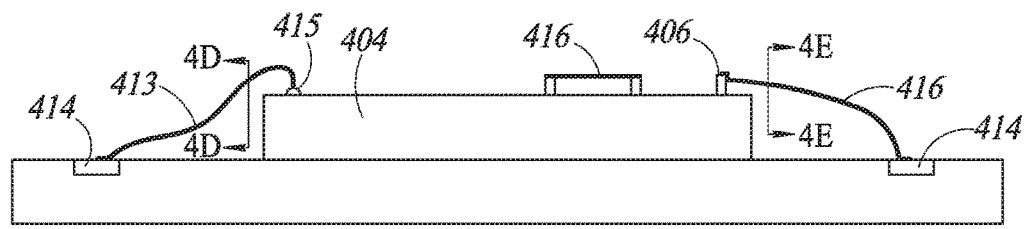

In other exemplary devices, such as device 400 depicted in FIGS. 4A-C, at least one secondary wire 413 that is not an ink printed wire may be included with this package. The secondary wire may be formed before or after a plurality of ink printed wires 410. Standard wires have a circular cross-section, see FIG. 4D. Ink printed wires have a different cross section, that is rectangular, see FIG. 4E. According to device 400, the at least one secondary wire 413 provides power to a die 404 by an electrical coupling between one or more of a plurality of pillars 406 on the die 404 and one or more of a plurality of contact pads 414 on a package substrate 402.

The secondary wire 413 is coupled to a contact pad 415 on the die 404. This secondary wire 413 is not raised or otherwise elevated off of the surface of the die 404 and thus, a pillar can be omitted from this coupling.

After connecting the at least one secondary wire 413, as in FIG. 4A, a sacrificial layer 408 is deposited and the ink printed wires 410 are printed on a surface of the sacrificial layer 408 between one or more of the pillars 406 and one or more of the contact pads 414, as shown in FIG. 4B. The sacrificial material covers a portion of the secondary wire while another portion is exposed above the sacrificial material.

The wires are then solidified, such as by heat to sinter the ink printed wires 410 to form one or more solid ink printed wires 416. The sacrificial layer 408 is also removed, as in FIG. 4C. Although not shown, molding compound is placed according to the exemplary embodiments of the present disclosure and it may be possible to connect the at least one secondary wire 413 after printing the ink printed wires 410. The ink printed wire has a different curvature than the secondary wire as the ink printed wire inherits the curvature of the sacrificial material on which it was formed.

Figure 4D:
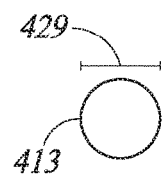
Figure 4E:
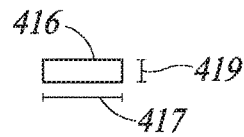

FIG. 4D is a cross section of the secondary wire 413 along the line 4D-4D and FIG. 4E is a cross section along the line 4E-4E of one of the solid ink printed wires 416. The secondary wire 413 is substantially circular with a diameter 429 that varies depending on the type of wire or application, but is consistent along a length of the secondary wire 413. On the other hand, the cross-section of the solid ink printed wires 416 demonstrates that the solid wires 416 have a substantially rectangular shape, with a width 417 and a height 419. The ink printed wire 416 may have a consistent width and height throughout or the width 417 or the height 419, or a combination of both, may change or vary along a length of the solid ink printed wires 416.

For example, the solid ink printed wires 416 could have the width 417 and the height 419 larger at a point where the solid ink printed wires 416 contacts one of the contact pads 414 than where that wire contacts one of the pillars 406. In other words, the width 417 or the height 419, or both, can be larger or smaller at either end, or anywhere along the length of the solid wires 416, which further increases the flexibility in applying the present disclosure.

Figure 5A:
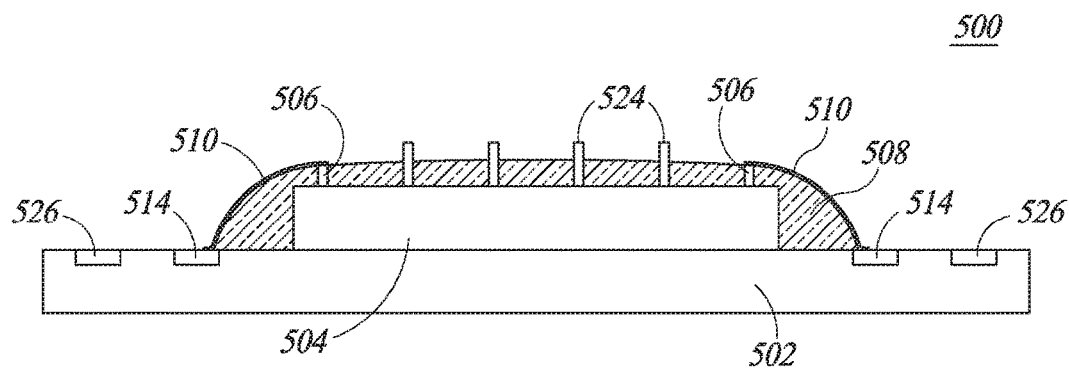
FIGS. 5A-C are views of an alternative exemplary embodiment of the present disclosure having multiple sacrificial layers and pillars of different heights on one die.
Figure 5B:
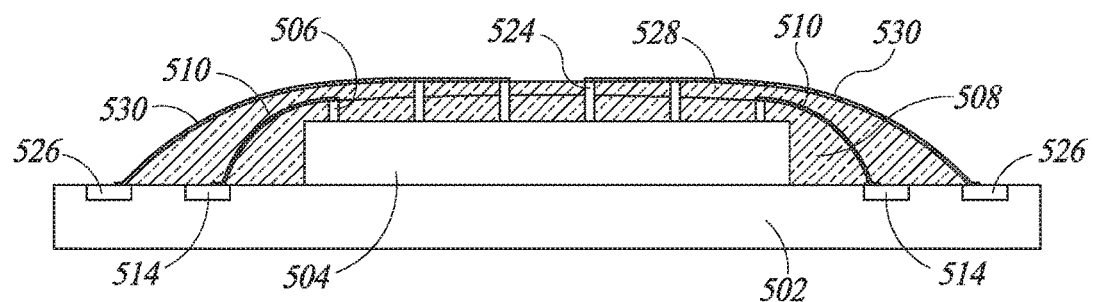
Figure 5C:
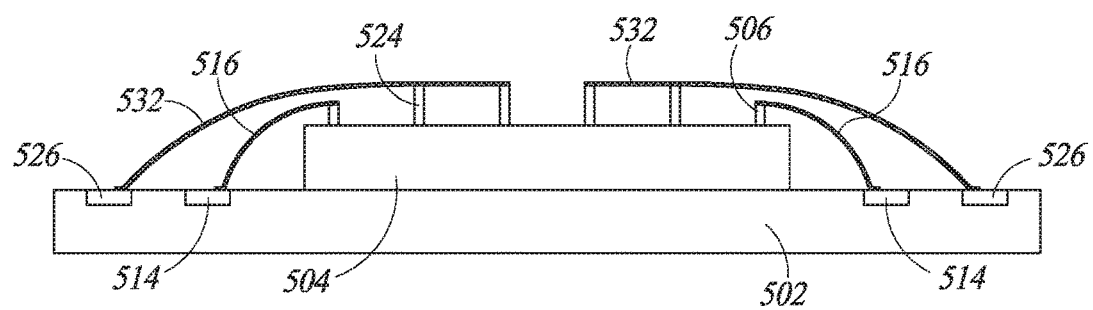

FIGS. 5A-5C include another exemplary embodiment of a device 500 formed using more than one sacrificial layer 508, 528. In this Figure a die 504 includes a first plurality of pillars 506 and a second plurality of pillars 524, each of the plurality of pillars having different heights. The second plurality of pillars 524 being taller than the first plurality of pillars, i.e., each second pillar is taller than each first pillar. Ink printed wires 510, 530 couple the pillars to ones of a plurality of contact pads 514, 526.

The device 500 includes the die 504 coupled to a package substrate 502. Accordingly, a first sacrificial layer 508 is deposited over a portion of the die 504 and the package substrate 502, as in FIG. 5A. A first plurality of ink printed wires 510 are formed on a surface of the first sacrificial layer 508, extending from a first plurality of contact pads 514 to the first pillars 506. The second pillars remain uncovered by wires or the first sacrificial material. Once the first sacrificial layer 508 is in place and the first wires are printed, a second sacrificial layer 528 is formed on top of the first sacrificial layer 508, as in FIG. 5B. The second sacrificial layer 528 covers the first pillars and the first ink printed wires 510. A second plurality of ink printed wires 530 are printed on a surface of the second sacrificial layer 528 with the ink printed wires 530 extending from a second plurality of contact pads 526 to the pillars 524.

Once the first sacrificial layer 508 and the second sacrificial layer 528 are in place and the second wires are formed, the first and second sacrificial layers are removed, as in FIG. 5C. They may be removed by heat, which may also sinter the first ink printed wires 510 and the second ink printed wires 530, until the first ink printed wires 510 and the second ink printed wires 530 solidify into a first plurality of solid ink printed wires 516 and a second plurality of solid ink printed wires 532, respectively, as shown in FIG. 5C. Although not shown, molding compound is then formed around the first and second wires 516, 532, on the die, and on the substrate to form a final package. The second wires 532 are coupled to two pillars, however, they may be only coupled to one pillar. The coupling will be determined by operation of the final product. In other embodiments, multiple layers of sacrificial material and ink printed wires can be used to reach contact pads placed successively further from a center of the die 504, which increases the possible wire configurations and overall contacts capable in an integrated circuit package.

A fourth exemplary device 600, as in FIGS. 6A-6D, includes a first die 602 and a second die 604 and multiple sacrificial layers. The first die 602 is coupled to a package substrate 606 and the second die 604 is coupled to the first die 602. The first die 602 and the second die 604 each have a plurality of pillars, a first plurality of pillars 614 and a second plurality of pillars 616, as in FIG. 6A. A first sacrificial layer 612 is formed on the first die and the second die. The first sacrificial layer is between the first die and a first plurality of contact pads 608. A top surface of the first pillars 614 remains exposed by the first sacrificial layer. A first plurality of ink printed wires 618 are formed on a surface of the first sacrificial layer 612. The first sacrificial layer 612 abuts a side surface of the second die 604. Depending on a height of the first pillars the sacrificial layer may be on the top surface of the second die.

Figure 6A:
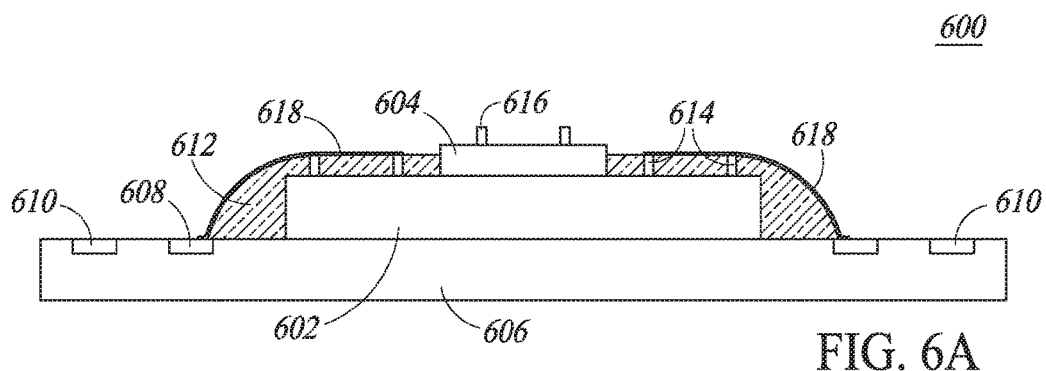
FIGS. 6A-D are views of an exemplary device according to the present disclosure for creating an integrated circuit package using multiple sacrificial layers and multiple pluralities of ink printed wires connecting two or more die to a substrate.
Figure 6B:
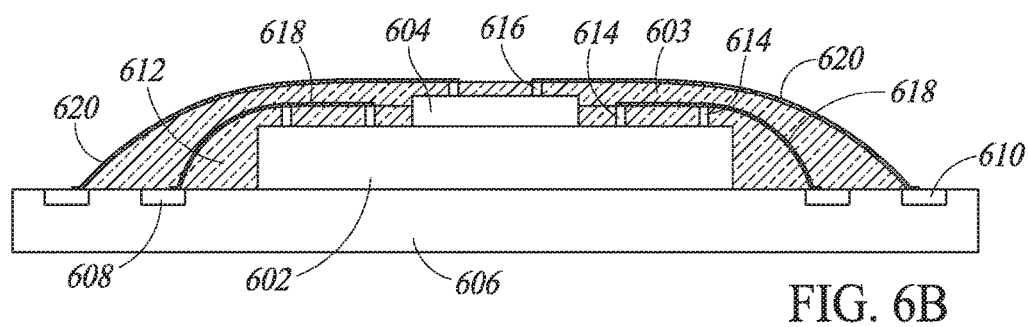

Similar to how other embodiments employ multiple layers, a second sacrificial layer 603 can be deposited on a portion, or over the entire surface, of the first sacrificial layer 612, the first wires 618, and the second die 604, as in FIG. 6B. However, the difference in such an embodiment being that the second sacrificial layer 603 may extend from the second plurality of contact pads 610 to the second die pillars 616, such that the second ink printed wires 620 can be printed from the second die pillars 616 to the second contact pads 610. Accordingly, this embodiment of the exemplary device 600 could also be applied with additional die and additional pluralities of contact pads.

Figure 6C:
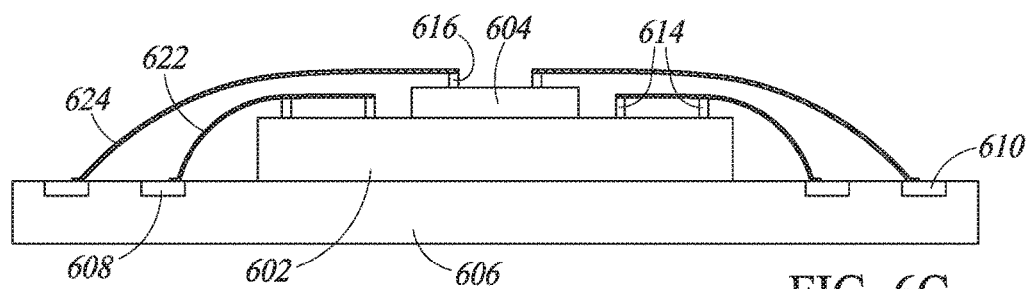
Figure 6D:
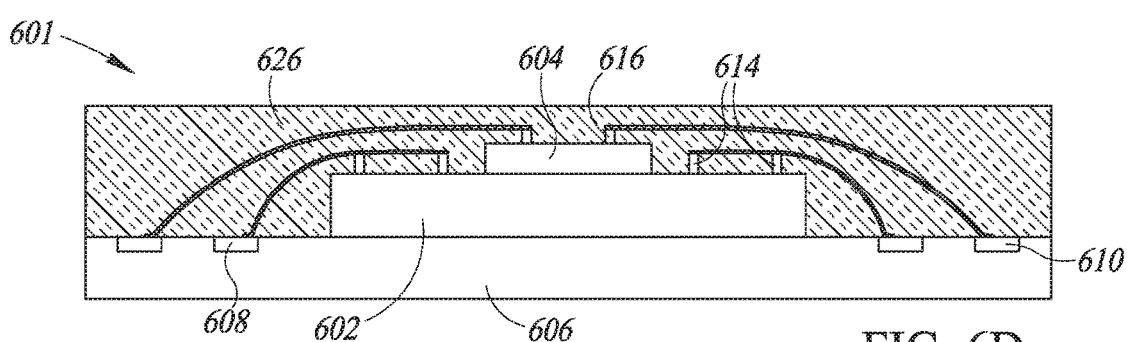

Once the thermal sacrificial layers 612, 603 and the ink printed wires 618 and 620 have been formed, heat may be applied to sublimate the thermal sacrificial layers 612, 603 and sinter the wires 618, 620, as in other embodiments, to form a first plurality of solid ink printed wires 622 and a second plurality of solid ink printed wires 624, as in FIG. 6C. Once the solid wires 622, 624 are formed, a molding compound 626 can be placed substantially surrounding the first die 602, the second die 604, the package substrate 606 and each of the first solid ink printed wires 622 and the second solid ink printed wires 624 to create an integrated circuit package 601, as in FIG. 6D. In some embodiments, each of the first solid ink printed wires 622 and the second solid ink printed wires 624 have a substantially rectangular cross-section that is variable along a length of a given wire, as in other embodiments, with the molding 626 substantially contacting every surface of each wire, or substantially covering each wire.

Another exemplary embodiment of a device 700, as depicted in FIGS. 7A-D, includes a first set of ink printed wires 722, 724 and secondary wires 705a, 705b and first and second die 702, 704. This device combines several types of die with several types of wires. The secondary wire 705a is coupled to a first contact 714 and the secondary wire 705b is coupled to a second contact 716 on the second die. The secondary wires may be coupled to planar contact pads as are used in standard wire bonding techniques. On the opposite end of the secondary wires 705a, 705b, a connection is made with a first contact pad 708 and a second contact pad 710. The secondary wires 705 may be of a different type or composition than the ink printed wires. In some examples, the secondary wires 705 have a substantially circular cross-section and provide power to a first die 702 or a second die 704, or a combination of both.

Figure 7A:
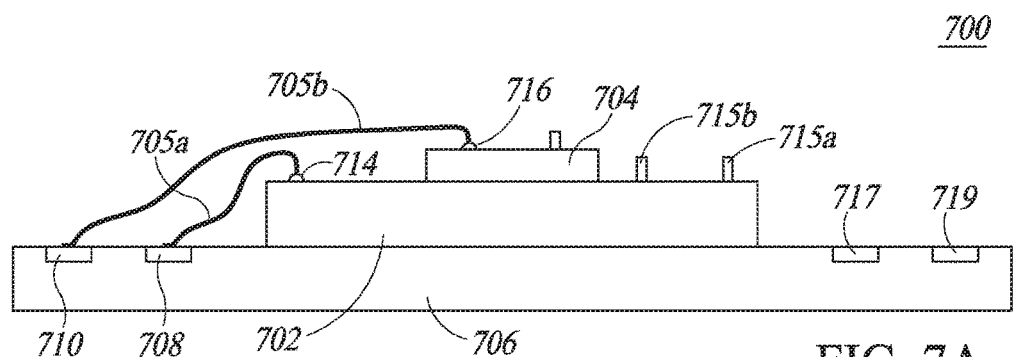
FIGS. 7A-D are views of an alternative exemplary embodiment of the of the present disclosure having two die, printed wires, and secondary wires.
Figure 7B:
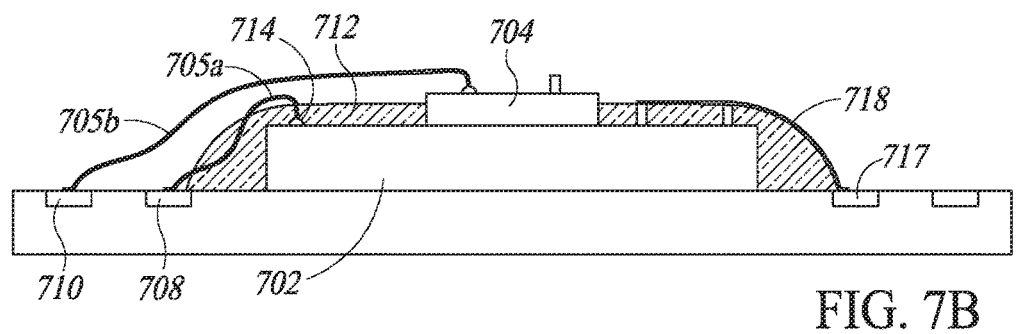
Figure 7C:
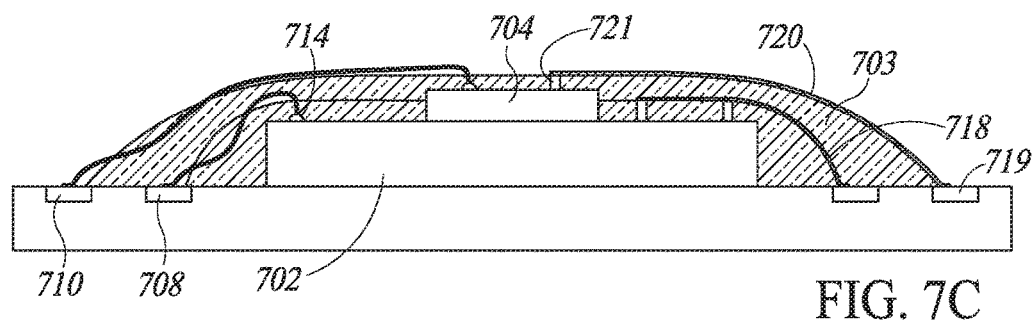
Figure 7D:
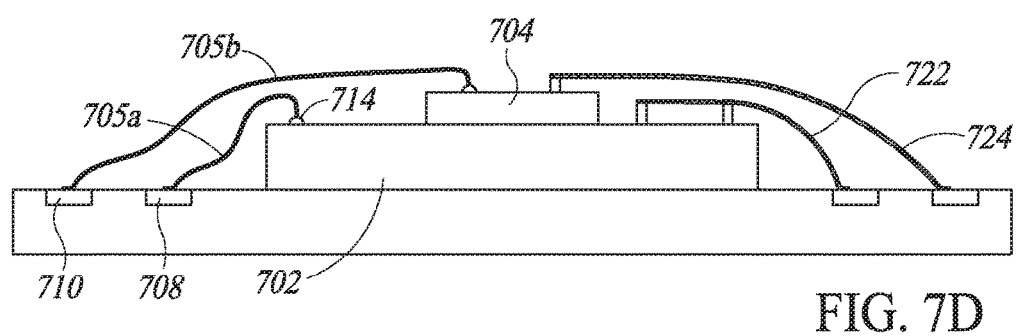

Once the secondary wires 705 are in place, as in FIG. 7A, a first sacrificial layer 712 is formed on the package substrate 706, as in FIG. 7B. The first sacrificial layer 712 will cover a portion of the secondary wires 705, and portions of the package substrate 706, the first die 702 and the second die 704. After depositing the first sacrificial layer 712, a first plurality of ink printed wires 718 are formed on the surface of the first sacrificial layer 712 coupling pillars 715a, 715b from the first die to the contact pad 717. A second sacrificial layer 703 is formed over the first sacrificial layer 712 and the wires 718. The second sacrificial layer covers a portion of the secondary wires 705a, 705b. A second plurality of ink printed wires 720 are formed on a surface of the second sacrificial layer 703, as in FIG. 7C, extending from the pillar 721 to the contact pad 719.

In some embodiments, part of either the first sacrificial layer 712 or the second sacrificial layer 703 may contact or cover part or substantially all of the secondary wires 705. After the layers and the printed wires are in place, heat can be applied to solidify the first ink printed wires 718 and the second ink printed wires 720 into a first plurality of solid ink printed wires 722 and a second plurality of solid ink printed wires 724, respectively, while also removing the first sacrificial layer 712 and the second sacrificial layer 703, as in FIG. 7D. Although not shown, molding compound can then be placed according to the exemplary embodiments of the present disclosure. In addition, it may also be possible to add the at least one secondary wire 705 after ink printing, heating the various components, and after removing the sacrificial layer.

Figure 8A:
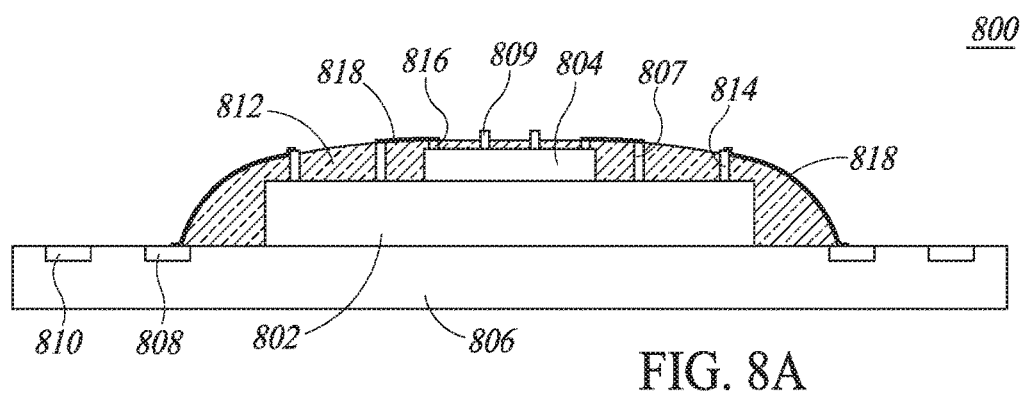
FIGS. 8A-C are views of an alternative exemplary embodiment of the present disclosure having multiple pillar heights on different die.
Figure 8B:
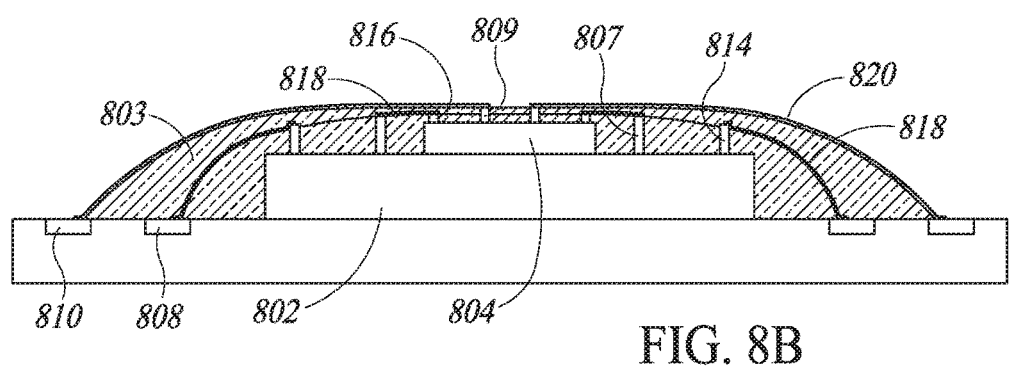
Figure 8C:
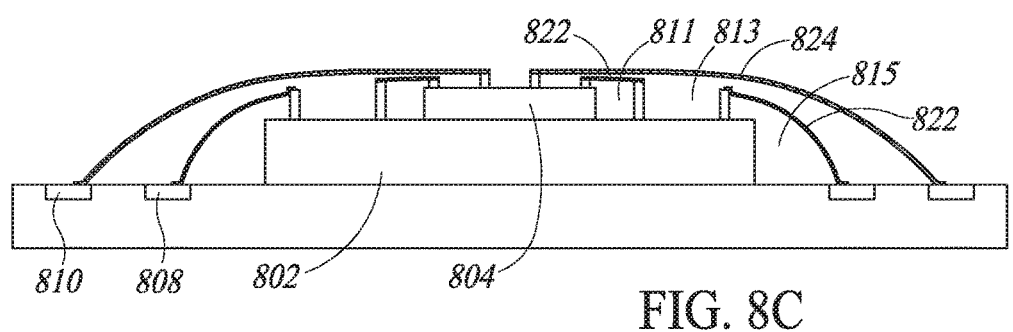

FIGS. 8A-8C include another embodiment of a device 800 that includes multiple die, multiple sacrificial layers, and pillars of varying height. An integrated circuit package 800 includes a first die 802 that is coupled to a package substrate 806 that has a first plurality of contact pads 808 and a second plurality of contact pads 810. A second die 804 is coupled to the first die 802, as in FIG. 8A. The first die 802 includes a first plurality of pillars 814 having a first height and a second plurality of pillars 807 having a second, greater height. The second die 804 includes a similar arrangement with the second die 804 having a third plurality of pillars 816 with a first height and a fourth plurality of pillars 809 with a greater, second height. Although depicted with this particular configuration, a height of each of the plurality of pillars can be varied according to particular applications for the integrated circuit package 800.

Once the first die 802 and the second die 804 are coupled to the package substrate 806, a first sacrificial layer 812 is deposited such that a first plurality of ink printed wires 318 are printed on a surface of the first sacrificial layer 812 between one or more of the second pillars 807 and one or more of the third pillars 816, or between one or more of the first contact pads 808 and one or more of the first pillars 814, or any combination thereof. Once the first sacrificial layer 812 and the first ink printed wires 818 are in place, a second sacrificial layer 803 is deposited and a second plurality of ink printed wires 820 are printed between the fourth pillars 809 and the second contact pads 810, as FIG. 8B. In such a manner, the present embodiments allow for wires to connect multiple layers to multiple rows of contact pads, even if the contact pads are positioned successively further from a center of die 802, 804.

After the layers and the printed wires are in place, heat is used to solidify the first ink printed wires 818 and the second ink printed wires 820 into a first plurality of solid ink printed wires 822 and a second plurality of solid ink printed wires 824, respectively, while also removing the first sacrificial layer 812 and the second sacrificial layer 803, as in FIG. 8C. Finally, although not shown, a molding compound is then formed over the wires and other components to form an integrated circuit package. The molding compound will be positioned between the first die 802 and the wires 822 in opening 815. The molding compound will be positioned between the wires 822 and the wires 824 and between the wires 824 and a top surface of the first die 802 in opening 813. The molding compound will be positioned between the wires 822 and the first die and the second die in opening 811. In addition, the molding compound will completely cover the second die 804, the contact 810, 808, and the wires 822 to form a complete package.

Figure 9:
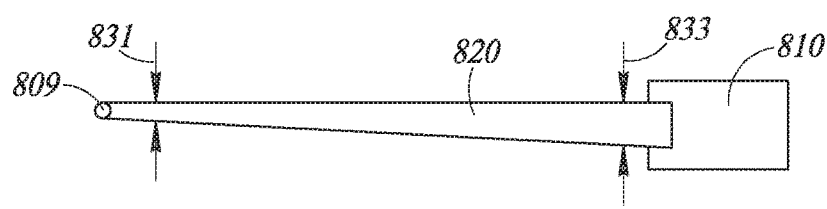
FIG. 9 is a top down view of a wire with varying dimensions.

FIG. 9 is a top down view of the ink printed wire 822 that extends from the pillar 809 to the contact pad 810. The ink printed wire has a first dimension 831 and a second dimension 833 that is wider than the first dimension. The ink printed wire gradually gets wider from the pillar to the contact pad.

Each of the pillars described in this disclosure can be replaced by a bump or other contact mechanism that is not has tall. A type of electrical contact selected will depend on the types of die included in the package. A height of each pillar or bump can be different than adjacent pillars or bumps. In some embodiments, the package may include pillars in some locations and bumps in others. This may also include planar contacts pads on the top surface of the die adjacent to the bumps or pillars.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a package substrate;
a plurality of contact pads on the package substrate;
a first die coupled to the package substrate;
a first plurality of pillars on the first die; and
a first plurality of ink printed wires, each of the first plurality of ink printed wires electrically coupled between at least one of the plurality of contact pads on the package substrate and at least a corresponding one of the first plurality of pillars on the first die, at least one of the first plurality of ink printed wires having a first width adjacent to the first die and a second width adjacent to the respective at least one of the plurality of contact pads, the first width being different than the second width, wherein the at least one of the first plurality of ink printed wires contacts a top surface and a side surface of one of the first plurality of pillars.

2. The device of claim 1 wherein the first width is smaller than the second width.

3. The device of claim 1, further comprising a second die on the first die and a second plurality of ink printed wires coupled between the second die and the plurality of contact pads.

4. The device of claim 3 wherein molding compound surrounds the first and second plurality of ink printed wires.

5. The device of claim 3 wherein the second die further comprises a second plurality of pillars on the second die, at least one of the first plurality of ink printed wires printed between and contacting at least one pillar of the first plurality of pillars and at least one pillar of the second plurality of pillars.

6. The device of claim 1 wherein a first one of the first plurality of ink printed wires has a first material composition and a second one of the first plurality of ink printed wires has a second material composition different from the first material composition.

7. The device of claim 1 wherein each of the first plurality of ink printed wires has a substantially rectangular cross-section.

8. The device of claim 1 wherein at least one of the first plurality of ink printed wires is printed between and contacts at least two of the first plurality of pillars and at least one of the plurality of contact pads on the package substrate.

9. A system, comprising:
a substrate;
a first die on the substrate, the first die including a first plurality of pillars; and
a first plurality of ink printed wires, each wire having a first surface facing the die and a second surface opposite the first surface, at least a first one of the first plurality of ink printed wires being coupled to a first one of the first plurality of pillars and the substrate and printed along and in contact with a top surface and a side surface of the first one of the first plurality of pillars, at least a second one of the first plurality of ink printed wires printed between and in contact with a second one and a third one of the first plurality of pillars.

10. The system of claim 9 wherein at least one of the first plurality of ink printed wires has a first dimension and a second dimension, the first dimension being closer to the first die, the first dimension being different than the second dimension.

11. The system of claim 10 where in the second dimension is smaller than the first dimension.

12. The system of claim 9 further comprising an encapsulant that is between the first plurality of ink printed wires and the substrate.

13. The system of claim 9, further comprising a second die on the first die and a second plurality of ink printed wires coupled between the second die and the substrate.

14. The device of claim 13 further comprising:
a third plurality of ink printed wires coupled between the first die and the second die.

15. A device, comprising:
a substrate;
a first die on the substrate;
a first pillar, a second pillar, and a third pillar on the first die, the first pillar having a first surface and a second surface transverse to the first surface;
a first ink printed wire having a rectangular cross-section coupled between the first pillar and the substrate, the first ink printed wire having a first width adjacent to the first die and a second width adjacent to the substrate, the first width being different than the second width, the first ink printed wire in contact with the first surface and the second surface of the first pillar; and a second ink printed wire coupled between only the second pillar and the third pillar on the first die.

16. The device of claim 15, further comprising a third wire having a rectangular cross-section coupled between the first die and the substrate, the third wire having a first width adjacent to the first die and a second width adjacent to the substrate, the first width being different than the second width.

17. The device of claim 15 wherein the second wire contacts a top surface of each of the second pillar and the third pillar.

18. The device of claim 15 further comprising:
a fourth pillar on the first die;
a second die on the first die, the second die having fifth and sixth pillars;
a fourth ink printed wire coupling the fifth pillar on the second die to the substrate; and
a fifth ink printed wire coupling the sixth pillar on the second die to the fourth pillar on the first die.

19. The device of claim 15 wherein a height of the first pillar is less than a height of the second and third pillars.

20. The device of claim 15 further comprising:
a fourth pillar on the first die; and
a secondary wire coupled between the fourth pillar on the first die and the substrate, the secondary wire having a circular cross-section and a composition that is different than a composition of the first ink printed wire and a composition of the second ink printed wire.

* * * * *